(12) United States Patent
Yamashita et al.

(10) Patent No.: US 6,916,743 B2
(45) Date of Patent: Jul. 12, 2005

(54) SEMICONDUCTOR DEVICE AND METHOD FOR MANUFACTURING THEREOF

(75) Inventors: Tomio Yamashita, Ogaki (JP); Yoshio Okayama, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 309 days.

(21) Appl. No.: 10/197,575

(22) Filed: Jul. 18, 2002

(65) Prior Publication Data

US 2003/0017707 A1 Jan. 23, 2003

(30) Foreign Application Priority Data

Jul. 19, 2001 (JP) ........................................ 2001-219173

(51) Int. Cl.$^7$ ............................................ H01L 21/302
(52) U.S. Cl. ...................... 438/694; 438/696; 438/697; 438/698; 438/700
(58) Field of Search ................................ 438/694, 696, 438/697, 698, 700

(56) References Cited

U.S. PATENT DOCUMENTS

| | | | |
|---|---|---|---|
| 6,186,068 B1 | 2/2001 | Gelbart | 101/486 |
| 6,326,300 B1 * | 12/2001 | Liu et al. | 438/638 |
| 6,624,061 B2 * | 9/2003 | Aoki | 438/622 |
| 6,780,775 B2 * | 8/2004 | Ning | 438/706 |
| 2001/0042469 A1 | 11/2001 | Vosseler | 101/401.1 |

FOREIGN PATENT DOCUMENTS

| | | |
|---|---|---|
| EP | 1 151 857 A2 | 11/2001 |
| GB | 2 273 464 A | 6/1994 |
| JP | 09-223656 | 8/1997 |
| JP | 11-54404 | 2/1999 |
| JP | 11-067894 | 3/1999 |
| JP | 2000-031114 | 1/2000 |
| JP | 2002-043201 | 2/2002 |

OTHER PUBLICATIONS

Japanese Patent Office Communication dated Apr. 20, 2004 for Japanese Application No. 2001–219173.

Japanese Patent Office Communication dated Apr. 20, 2004 for Japanese Application No. 2001–219173 and English language translation.

European Search Report dated Nov. 7, 2002.

* cited by examiner

*Primary Examiner*—Nadine G. Norton
*Assistant Examiner*—Binh X. Tran
(74) *Attorney, Agent, or Firm*—Westerman, Hattori, Daniels & Adrian, LLP

(57) ABSTRACT

A semiconductor device manufacturing method that enables accurate recognition of an alignment mark and optimal formation of a buried wiring. The method includes depositing an insulation film above a semiconductor device, and then etching the insulation film to form a buried wiring hole and an alignment mark pit in the insulation film. Subsequently, a conductive film is deposited on the surface of the insulation film that includes the buried wiring hole and the alignment mark pit. The conductive film is deposited so that it is less than the depth of the alignment mark pit and less than half of a minimum opening width of the alignment mark pit.

7 Claims, 12 Drawing Sheets

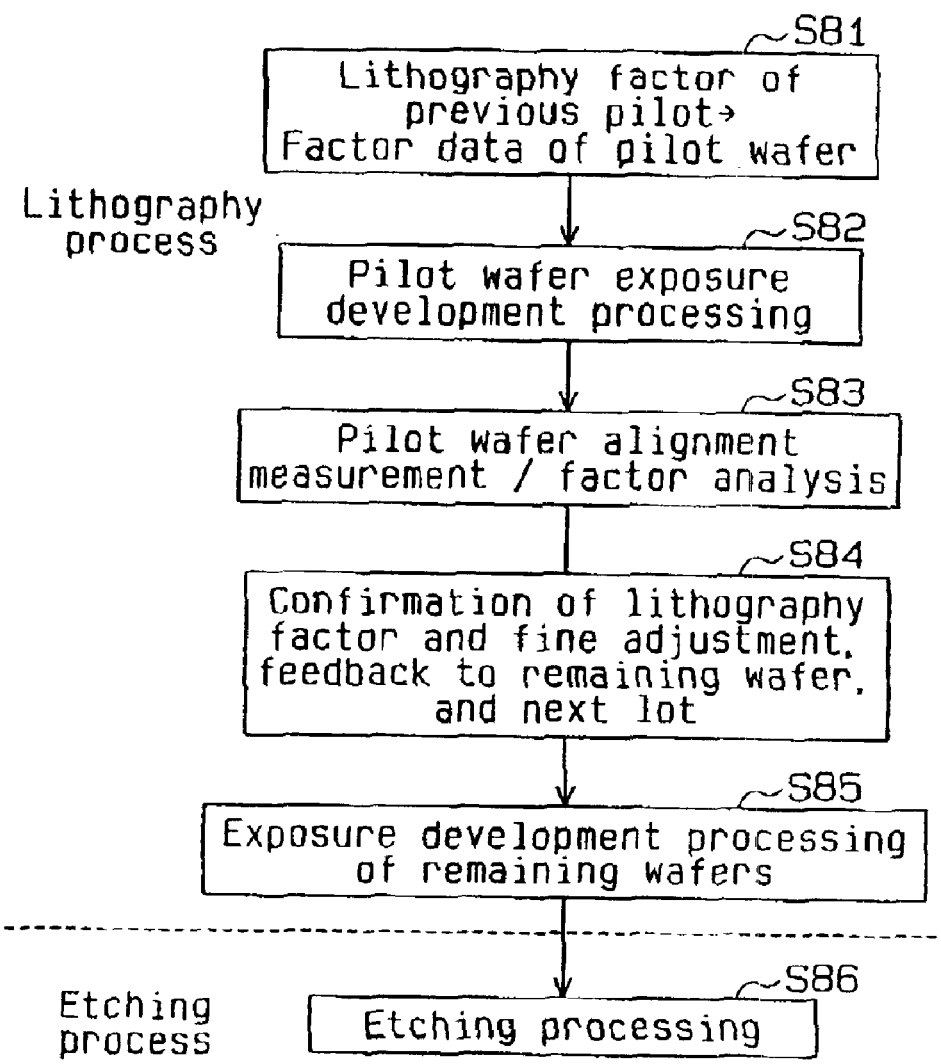

Fig.10

| D2 [μm] | Recognition of Depression 30 | Etching Residue |
|---|---|---|
| 0 | Impossible | None |
| 0.1 | Possible | None |
| 0.2 | Possible | None |
| 0.3 | Possible | None |
| 0.4 | Possible | None |
| 0.5 | Possible | None |
| 0.6 | Possible | Some |
| 0.7 | Possible | Yes |
| 0.8 | Possible | Yes |

SEMICONDUCTOR DEVICE AND METHOD FOR MANUFACTURING THEREOF

BACKGROUND OF THE INVENTION

The present invention relates to a semiconductor and a method for manufacturing the semiconductor, and more particularly, to a method for forming an alignment mark used to align a superimposing film in multilayer wiring.

The higher integration and miniaturization of recent semiconductor devices have decreased the focal depth of exposure in a lithography process when manufacturing a semiconductor device. This has also decreased the tolerable depth of stepped portions. Thus, a chemical mechanical polishing (CMP) process is employed not only to flatten the surface of a film in a global manner but also to form a buried wiring in an insulation film. A plug, which connects layers in a multilayer wiring, may be given as one example of a buried wiring. The CMP process is also widely applied to form such a plug.

When forming a multilayer wiring, the alignment of a pattern, which has been formed on a substrate, with a master pattern, which is transcribed in the lithography process, must be accurately performed.

FIG. 1 illustrates a method for correcting alignment deviation to perform alignment on a semiconductor substrate with high accuracy.

In the prior art, a deviated alignment amount (factor data) is calculated using a sample semiconductor substrate (pilot wafer) of a previous manufacturing lot. The calculated deviated alignment amount is set as an initial value (step S81). An exposure-development process is performed on the pilot wafer of the manufacturing lot that is to undergo exposure (step S82). Then, an alignment measurement of the present pilot wafer is performed, and the factor of the deviation amount obtained through the alignment measurement is analyzed (step S83). The factor data obtained through the factor analysis is considered the factor data of the remaining wafers in the present lot and used as the initial value of the factor data for the next manufacturing lot (step S84). Subsequently, the exposure-development process is performed on the remaining wafers of the present manufacturing lot (step S85). Japanese Laid-Open Patent Publication No. 11-54404 describes a prior art example of such method for correcting the alignment deviation amount.

To correct the alignment deviation amount through the prior art method, the position of an alignment mark formed on a semiconductor substrate must be accurately recognized. FIGS. 2 and 3 illustrate a prior art process for manufacturing a semiconductor device. In the semiconductor device, for example, a plurality of metal oxide semiconductor field effect transistors (MOSFETs) are formed on a silicon substrate, and the MOSFETs are connected to one another by means of multilayer wiring.

[First Operation] (FIG. 2A)

An insulation film 112 is applied to a silicon substrate 111, on which a device 110 is formed. The insulation film 112 is etched to form a hole 113 and an alignment mark (pit) 114. The hole 113 is used to form a buried wiring, which contacts the device 110.

[Second Operation] (FIG. 2B)

A metal film (buried film) 115, which is buried in the hole 113, is deposited on the surface resulting from the first operation so that the metal film 115 is grown to have a uniform thickness.

[Third Operation] (FIG. 2C)

The surface of the metal film 115 undergoes the CMP process until the insulation film 112 is exposed to form a plug 116. The plug 116 is a buried wiring formed by burying the metal film 115 in the hole 113.

[Fourth Operation] (FIG. 3A)

A wiring material is deposited on the surface of the polished metal film 115 and insulation film 112 to form a wiring layer 118. The wiring material is used to form a wiring connected to the plug 116.

[Fifth Operation] (FIG. 3B)

A lithography process is performed to transcribe a mask pattern 119. The position of the alignment mark 114 is referred to when aligning the mask pattern 119. A resist 120 is patterned to etch the wiring layer 118.

A semiconductor device that includes multilayer wiring is normally manufactured by performing the first to fifth operations. However, depending on the film forming condition of each layer, the pit, or the alignment mark 114, may completely be buried in the metal film 115 (FIG. 2C). In such a case, the surface subsequent to the CMP process is completely flattened. This eliminates the stepped portion that reflects the position of the alignment mark 114. Especially, when the wiring material deposited in the fourth operation is, for example, aluminum (Al), the opacity of aluminum hinders the recognition of the alignment mark. In such a case, even if there is a slight surface level difference reflecting the position of the alignment mark 114 subsequent to the third operation, the accuracy for recognizing the alignment mark 114 is not high.

An another prior art process for performing the CMP process to form a plug when the alignment mark pit is over-etched and the etching depth exceeds the thickness of the interlayer insulation film will now be discussed with reference to FIGS. 4 and 5. In the prior art, when forming a pattern of the insulation film, to completely etch an insulation film, for example, the insulation film is rather excessively etched (over-etched) to absorb differences in the etching speed and guarantee the patterning of the insulation film.

When forming a pattern in an insulation film, referring to FIG. 4A, an interlayer insulation film 124 is superimposed on the surface of an insulation film 122 and a wiring 123. The insulation film 122 is formed on the upper surface of an underlayer 121. The wiring 123 is formed in the insulation film 122. A hole 125 and an alignment mark pit 126, which is used for alignment with the hole 125, are formed in the interlayer insulation film 124. The wiring 123, which is connected to a plug 128, is normally arranged at the bottom of the hole 125, in which the plug 128 is formed. When the interlayer insulation film 124 is over-etched, the alignment mark pit 126 extends through the interlayer insulation film 124 and reaches the insulation film 122. The wiring 123 functions as an etching stopper of the interlayer insulation film 124.

Then, referring to FIG. 4B, a metal film (buried film) 127, which is used to form the plug 128, is deposited on the surface including the hole 125 and the alignment mark pit 126.

Subsequently, referring to FIG. 4C, the CMP process is performed to grind the surface of the metal film 127 until the upper surface of the interlayer insulation film 124 is exposed. This forms the plug 128. The deposition and polishing of the metal film 127 forms a stepped portion 129 in the alignment mark pit 126. The stepped portion reflects the position of the alignment mark pit 126.

Referring to FIG. 5A, an Al alloy film 131, which is an upper wiring layer of the plug 128, is deposited on the surface of the plug 128 and the interlayer insulation film 124, which includes the stepped portion 129 and a lower depression 130. A hard mask 132 is deposited on the surface of the Al alloy film 131. In this state, an upper depression 135 is formed above the lower depression 130. The hard mask 132 is used to reinforce a resist 133 and improve the manufacturing accuracy of the wiring when the Al alloy film 131 undergoes etching.

Then, referring to FIGS. 5B and 5C, lithography is performed to form the upper wiring layer (Al alloy film 131) by referring to the upper depression 135 for alignment. That is, the resist 133 is deposited on the hard mask 132, which covers the plug 128. As a result, only the portion of the Al alloy film 131 covered by the patterned resist 133 remains.

In the prior art method, the lower depression 130 is formed at a deep location relative to the surface of the interlayer insulation film 124. Thus, as shown in FIG. 5A, a large portion of the Al alloy film 131 and the hard mask 132 overhangs from the stepped portion of the lower depression 130. Thus, even if the Al alloy film 131 is over-etched, an etching residue 134 may remain in the lower depression 130, as shown in FIG. 5C.

The etching residue 134 may interfere with normal recognition of the alignment mark in subsequent processes. Further, when the etching residue 134 is dispersed on the surface of a film, the dispersed etching residue 134 may cause abnormal forming of the pattern.

SUMMARY OF THE INVENTION

It is an object of the present invention to provide a method for manufacturing a semiconductor device that accurately recognizes an alignment mark, which is used during alignment, to form a buried wiring in a preferable manner when employing a CMP process to form the buried wiring.

To achieve the above object, the present invention provides a method for manufacturing a semiconductor device. The method includes the steps of depositing an insulation film above a semiconductor device, etching the insulation film to form a buried wiring hole and an alignment mark pit, which is used for alignment, in the insulation film, and depositing a conductive film on the surface of the insulation film that includes the buried wiring hole and the alignment mark pit. The step of depositing the conductive film includes depositing the conductive film so that the thickness of the conductive film is less than the depth of the alignment mark pit and less than half of a minimum opening width of the alignment mark pit. The method further includes forming a buried film in the alignment mark pit and forming a buried wiring in the buried wiring hole to flatten the surface of the deposited conductive film until the surface of the insulation film is exposed.

A further perspective of the present invention is a method for manufacturing a semiconductor device. The method includes the steps of depositing an insulation film above a semiconductor device, and etching the insulation film to form a buried wiring hole and an alignment mark pit, which is used for alignment, in the insulation film. The etching step includes forming the alignment mark pit so that the depth of the alignment mark pit is equal to the thickness of the insulation film. The method further includes the step of depositing a conductive film on the surface of the insulation film that includes the buried wiring hole and the alignment mark pit. The step of depositing the conductive film includes depositing the conductive film so that the thickness of the conductive film is less than the thickness of the insulation film and less than half of a minimum opening width of the alignment mark pit. The method further includes forming a buried film in the alignment mark pit and forming a buried wiring in the buried wiring hole to flatten the surface of the deposited conductive film until the surface of the insulation film is exposed.

A further perspective of the present invention is a semiconductor device including a semiconductor substrate, an insulation film deposited above the semiconductor substrate, a buried wiring hole formed in the insulation film to form a buried wiring, an alignment mark pit formed in the insulation film and used for alignment, and a conductive film deposited in the buried wiring hole and the alignment mark pit. The conductive film deposited in the alignment mark pit has a thickness that is less than the depth of the alignment mark pit and less than half of a minimum opening width of the alignment mark pit.

A further perspective of the present invention is a semiconductor device including a semiconductor substrate, an insulation film deposited above the semiconductor substrate, a buried wiring hole formed in the insulation film to form a buried wiring, and an alignment mark pit formed in the insulation film and used for alignment. The depth of the alignment mark pit is equal to the thickness of the insulation film. A conductive film is deposited in the buried wiring hole and the alignment mark pit. The conductive film deposited in the alignment mark pit has a thickness that is less than the thickness of the insulation film and less than half of a minimum opening width of the alignment mark pit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1 is a flowchart illustrating the procedure for performing a lithography process in the prior art;

FIG. 10 is a table illustrating experiment results of conditions for accurately recognizing an alignment mark;

DETAILED DESCRIPTION OF THE PREFERRED EMBODIMENTS

Figure 2A:
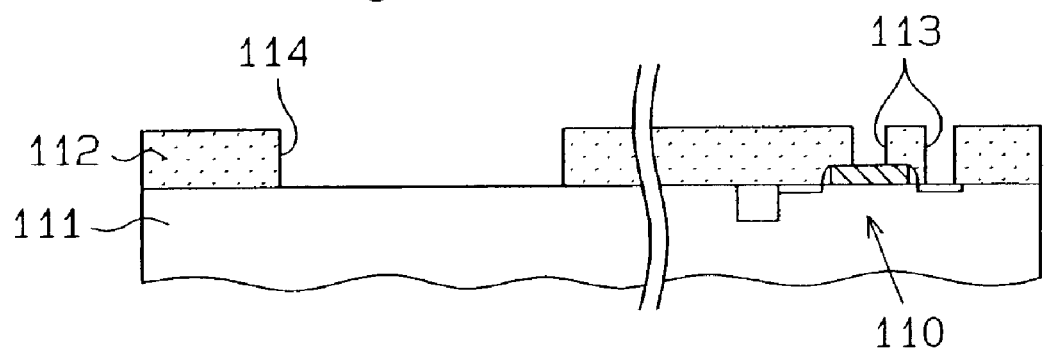
FIGS. 2A to 2C are cross-sectional views illustrating a process for forming a plug in a prior art semiconductor device manufacturing method.

In the drawings, like numerals are used for like elements throughout.

A method for manufacturing a semiconductor device according to the present invention will now be discussed with reference to FIGS. 6 and 7. In the first embodiment, a MOSFET 10 is formed on a silicon substrate 11 in the same manner as in the prior art. Plugs 16 connected to the MOSFET are buried in an insulation film 12.

Figure 2B:
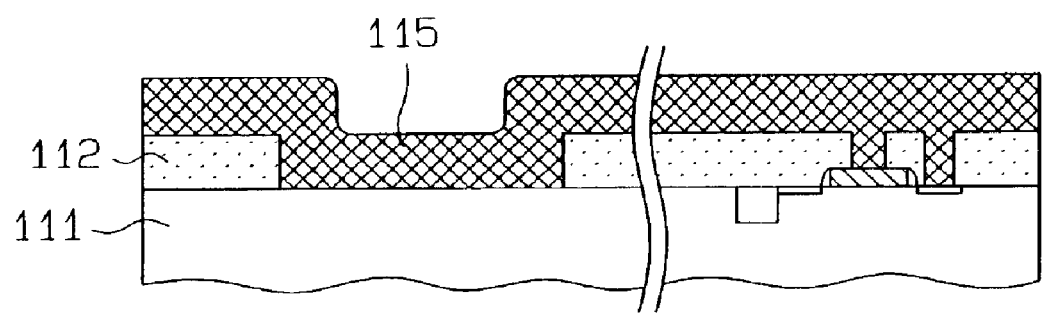
Figure 2C:
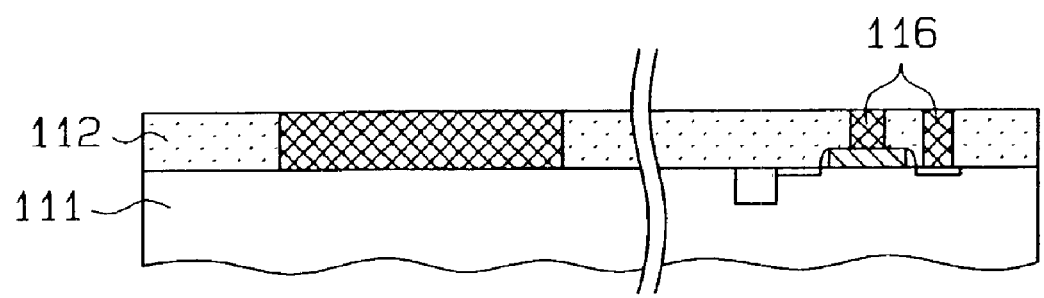
Figure 3A:
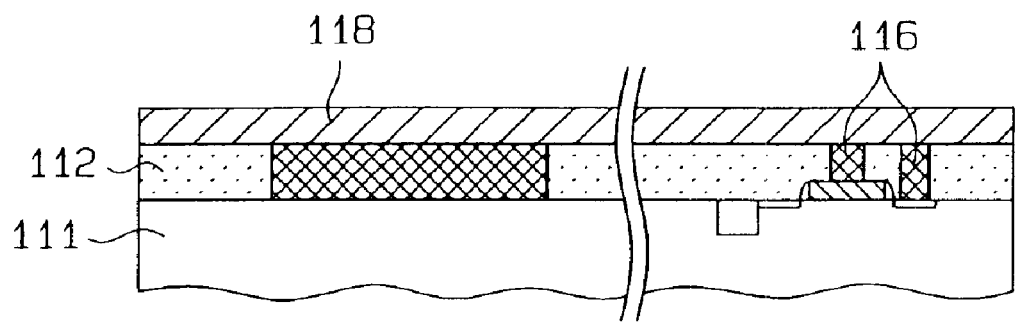
FIGS. 3A and 3B are cross-sectional views illustrating a process for patterning a wiring layer in the prior art method.
Figure 3B:
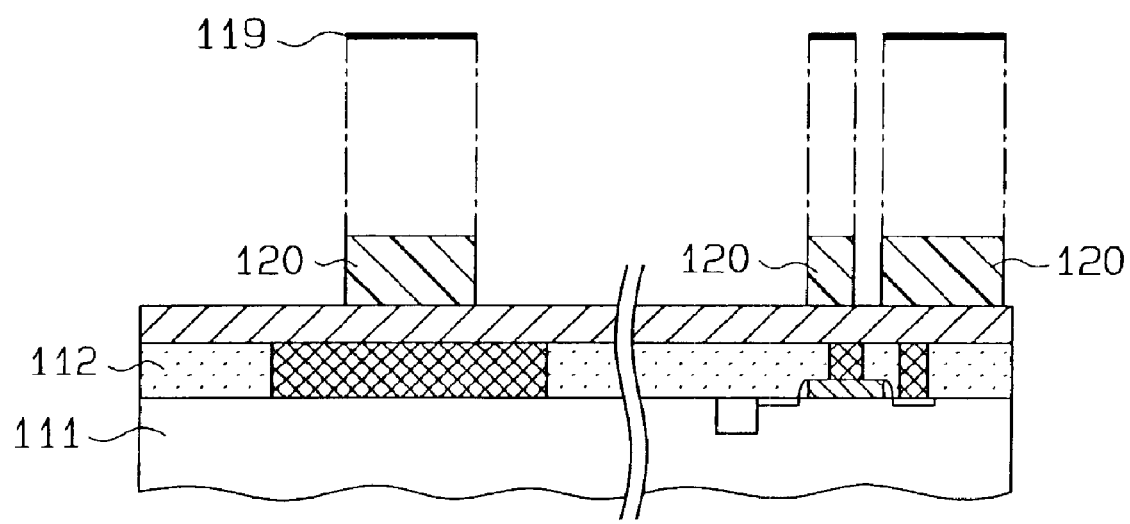
Figure 4A:
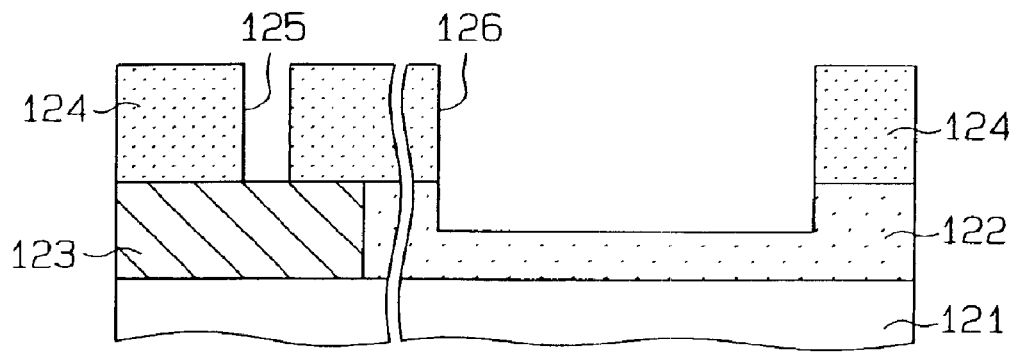
FIGS. 4A to 4C are cross-sectional views illustrating a process for forming a plug in a further example of a prior art semiconductor device manufacturing method.
Figure 4B:
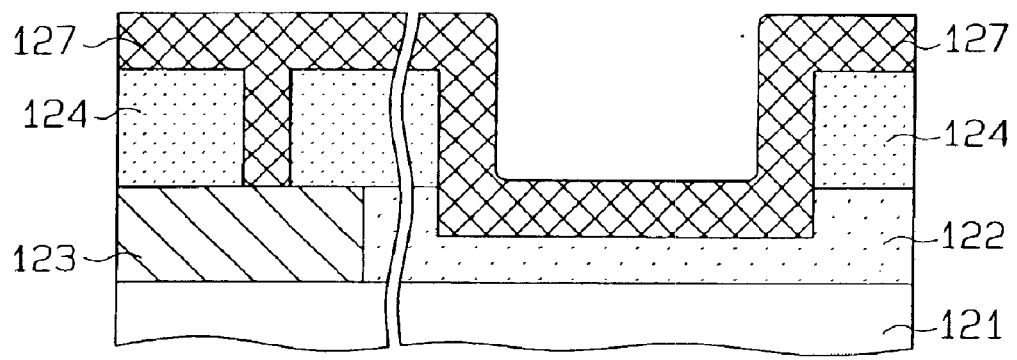
Figure 4C:
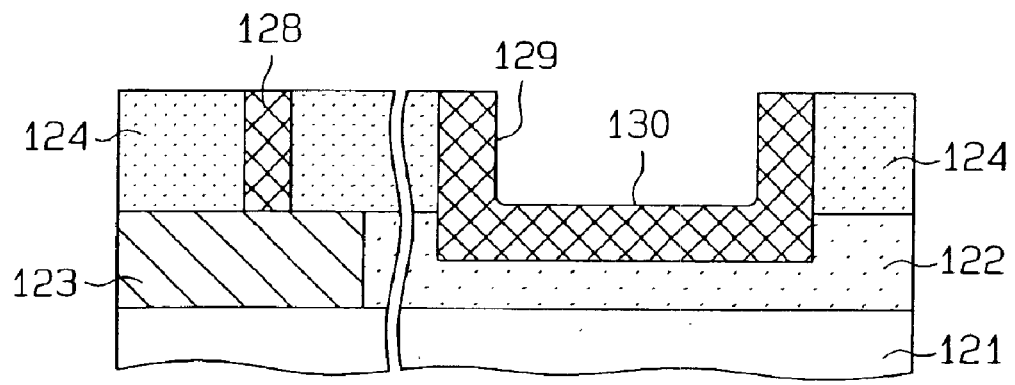
Figure 5A:
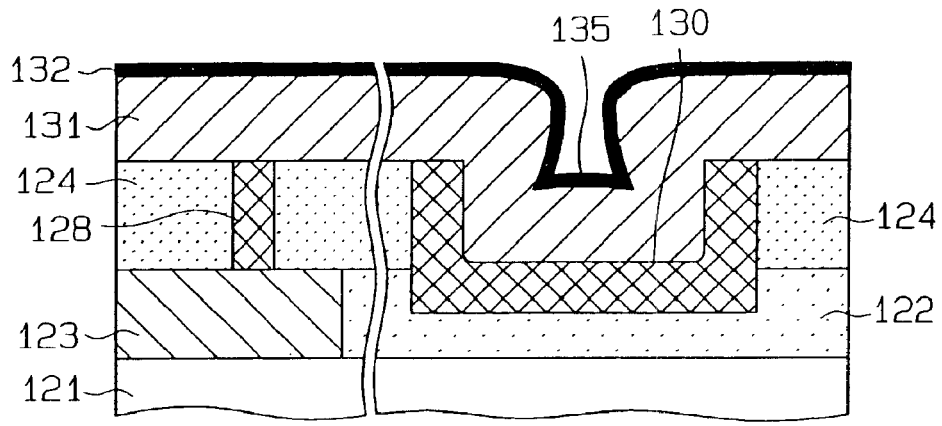
FIGS. 5A to 5C are cross-sectional views illustrating a process for patterning a wiring layer in the prior art example of FIGS. 6A to 6C.
Figure 5B:
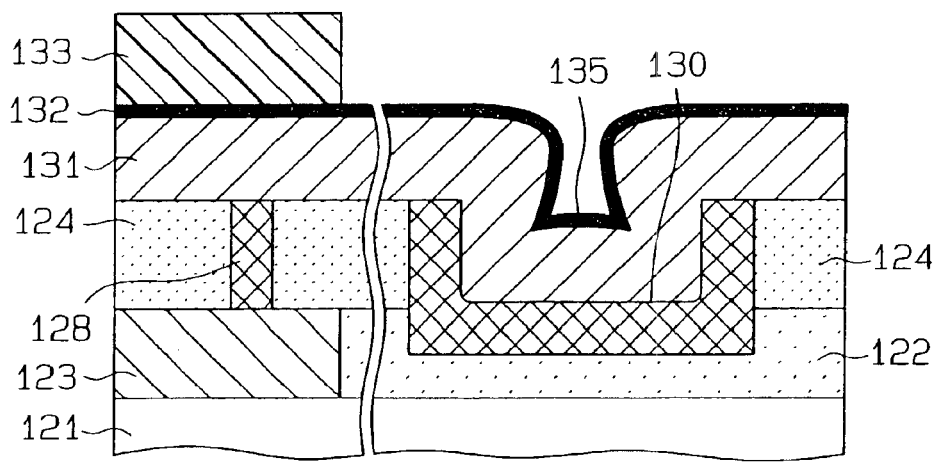
Figure 5C:
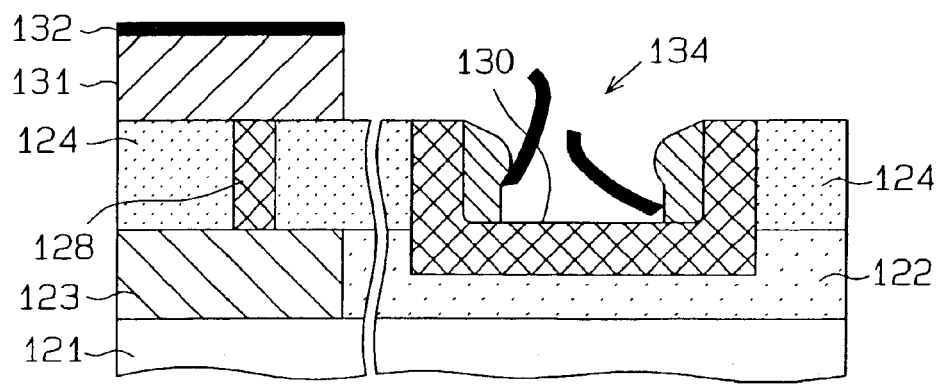

FIGS. 6 and 7 are cross-sectional views illustrating an example of a semiconductor device manufactured through first to fifth operations. The first to fifth operations of the first embodiment are substantially the same as the first to fifth operations of FIGS. 2 and 3. Parts differing from the operations of FIGS. 2 and 3 will be discussed below in detail.

Figure 6A:
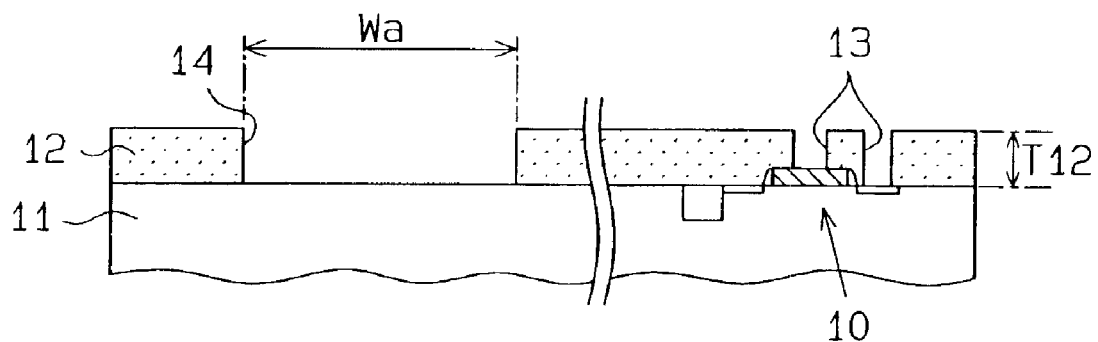
FIGS. 6A to 6C are cross-sectional views illustrating a process for forming a plug in a semiconductor device manufacturing method according to a first embodiment of the present invention.

[First Operation] (FIG. 6A)

An insulation film 12 is applied to the upper surface of the silicon substrate 11, on which the MOSFET 10 is formed. Holes 13 and an alignment mark pit 14 are formed in the insulation film 12. The depth of the pit 14 is equal to the thickness T12 of the insulation film 12 in which a plug 16 is buried. The alignment mark pit 14 has a rectangular form when seen from above. The width Wa of the shorter side (minimum opening width) of the alignment mark pit 14 is two times greater than the thickness T12 of the insulation film 12. The insulation film 12, which includes an organic spin-on glass (SOG) film, has a superimposed structure. The organic SOG film facilitates the formation of a thick insulation film. Thus, even if there is a significant level difference on the upper surface of the silicon substrate 11, the level difference is absorbed by the SOG film.

Figure 6B:
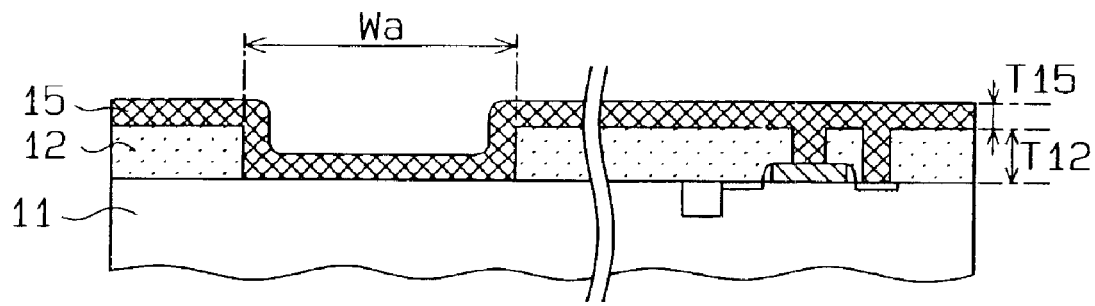

[Second Operation] (FIG. 6B)

A metal film (conductive film) 15 is deposited on the insulation film 12. This buries a wiring material in the holes 13. The metal film 15 is deposited so that it has a uniform thickness. The thickness T15 of the metal film 15 is controlled so that it does not exceed the thickness T12 of the insulation film 12. When the metal film 15 is deposited, the metal film 15 is buried in the cylindrical holes 13, which diameter is less than the thickness T12.

Figure 6C:
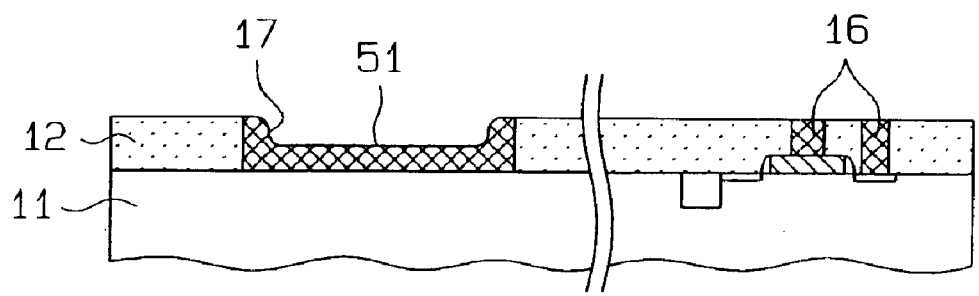

[Third Operation] (FIG. 6C)

The CMP process is performed to polish the surface of the metal film 15 and form a plug 16 in the hole 13. A stepped portion 17, which accurately reflects the position of the alignment mark pit 14, and a lower depression 51, which includes the stepped portion 17, are formed in the alignment mark pit 14.

Figure 7A:
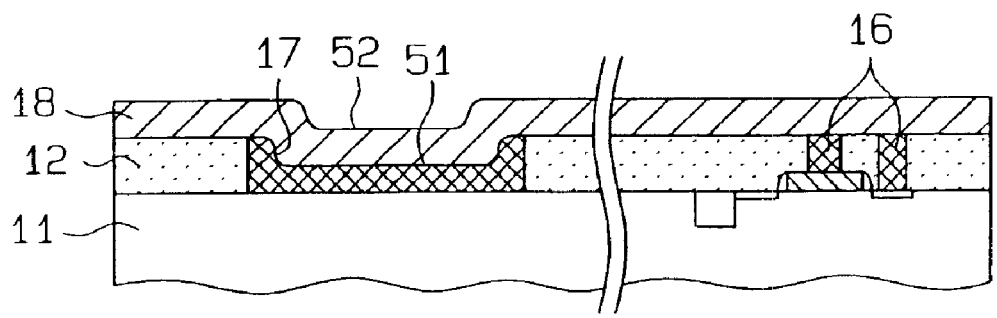
FIGS. 7A and 7B are cross-sectional views illustrating a process for patterning a wiring layer in the first embodiment.

[Fourth Operation] (FIG. 7A)

A wiring material is deposited to form a wiring layer 18. The thickness of the wiring layer 18 is significantly less than the width of the lower depression 51. An upper depression 52 is formed in the wiring layer 18 above the lower depression 51 to accurately reflect the position of the alignment mark pit 14.

Figure 7B:
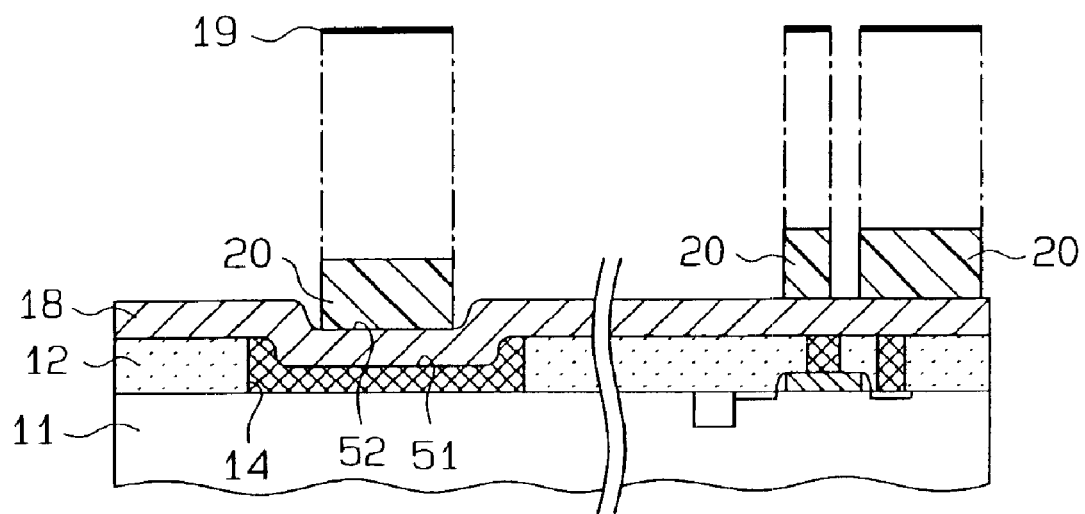

[Fifth Operation] (FIG. 7B)

A lithography process is performed to align a mask pattern, which is transcribed to a resist 20, in accordance with the upper depression 52. The resist 20 is patterned in accordance with the mask pattern 19, and the wiring layer 18 is etched in accordance with the patterned resist 20.

The position of the alignment mark pit 14, which is formed by etching the insulation film 12, is succeeded by the depressions 51 and 52 even after the deposition of the metal film 15 and the wiring layer 18. Accordingly, the resist 20 is accurately aligned with the alignment mark pit 14 and patterned regardless of whether the wiring layer 18 is opaque.

The first embodiment has the advantages described below.

(1) When forming the plug 16 in the insulation film 12, the metal film 15 is deposited in the surface of the insulation film 12, which includes pits formed through etching. In this state, the metal film 15, the thickness of which is less than the thickness T12 of the insulation film 12, is deposited in the alignment mark pit 14, the depth of which is equal to the thickness T12 of the insulation film 12. This guarantees the formation of the lower depression 51, which reflects the position of the alignment mark pit 14.

(2) The pattern of an upper layer, or the wiring layer 18, is accurately formed in accordance with the position of the lower depression 51. Further, the upper depression 52, which reflects the position of the alignment mark pit 14, is formed in the wiring layer 18. Thus, even if the wiring layer 18 is opaque, the resist 20, which is used for etching, is accurately patterned in accordance with the position of the upper depression 52.

A method for manufacturing a semiconductor device according to a second embodiment of the present invention will now be discussed with reference to FIGS. 8 to 10.

Figure 8A:
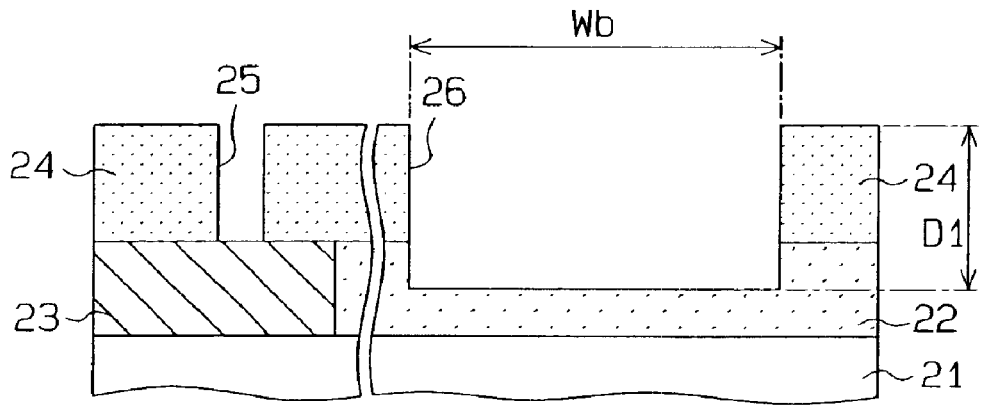
FIGS. 8A to 8C are cross-sectional views illustrating a process for forming a plug in a semiconductor device manufacturing method according to a second embodiment of the present invention.

Referring to FIG. 8A, an interlayer insulation film 22 and a wiring 23 are formed on an underlayer 21. The wiring 23 is formed in the insulation film 22. An interlayer insulation film 24, which is an organic SOG film, is superimposed on the surfaces of the interlayer insulation film 22 and the wiring 23. The interlayer insulation film 24 is etched to form a hole 25 and an alignment mark pit 26, which is used for alignment with the hole 25. The alignment mark pit 26 is rectangular. The wiring 23 is located at the bottom of the hole 25.

The wiring 23 functions as an etching stopper when forming the hole 25 and the alignment mark pit 26 in the interlayer insulation film 24. That is, after sufficiently performing etching, the depth of the hole 25 is equal to the depth of the interlayer insulation film 24, as shown in FIG. 8A. The alignment mark pit 26, which is formed by overetching the interlayer insulation film 24, is connected with the insulation film 22.

In the second embodiment, the thickness of a subsequently deposited metal film 27 is controlled as described below.

Figure 8B:
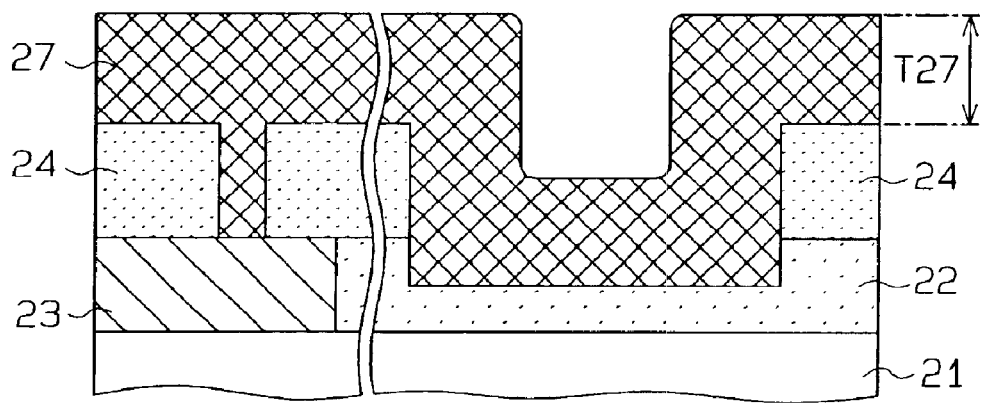

A nitride titanium (TiN) film (not shown) having a thickness of 10 nm, which serves as a barrier film of the hole 25, is applied to the wall of the hole 25 and the surface of the alignment mark pit 26. Then, a CVD process is performed to deposit 0.5 $\mu$m of tungsten (W) and form a metal film 27 on the surface of the titanium film while monitoring the growth in film thickness of the metal film 27 (FIG. 8B). During the deposition of the metal film 27, the thickness T27 of the metal film 27 is set to satisfy the following conditions.

Condition (A) The thickness T27 is less than half the shorter side width (minimum opening width) Wb of the alignment mark pit 26.

Condition (B) The thickness T27 is included in a range defined by subtracting "0.1 $\mu$m to 0.5 $\mu$m" from the depth of the alignment mark pit 26.

In other words, the growth of the metal film 27 is controlled so that the thickness T27 of the metal film 27 satisfies the two conditions of:

$$T27 \leq (\tfrac{1}{2})Wb; \text{ and}$$

$$(D1-0.5 \,\mu m) \leq T27 \leq (D1-0.1 \,\mu m).$$

Figure 8C:
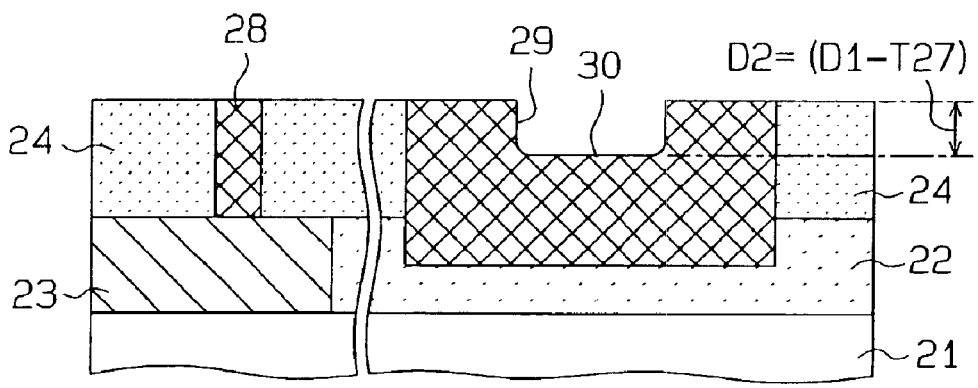

Then, the CMP process is performed to polish the surface of the metal film 27 until the upper surface of the interlayer insulation film 24 becomes exposed (FIG. 8C). In this state, a plug 28 is formed in the interlayer insulation film 24, and a lower depression 30, which includes a stepped portion 29, is formed in the alignment mark pit 26.

Condition (A) is set to prevent the pit 26 from being covered when the metal film 27 grows from the side walls of the alignment mark pit 26 after the metal film 27 is buried and polished in the alignment mark pit 26. Condition (B) is set to include the depth D2 of the lower depression 30 (i.e., (D1−T27)) in the range of "0.1 μm to 0.5 μm. In the second embodiment, the shorter side width Wb is significantly greater than the depth D1. Thus, condition (B) will be described below.

Figure 9A:
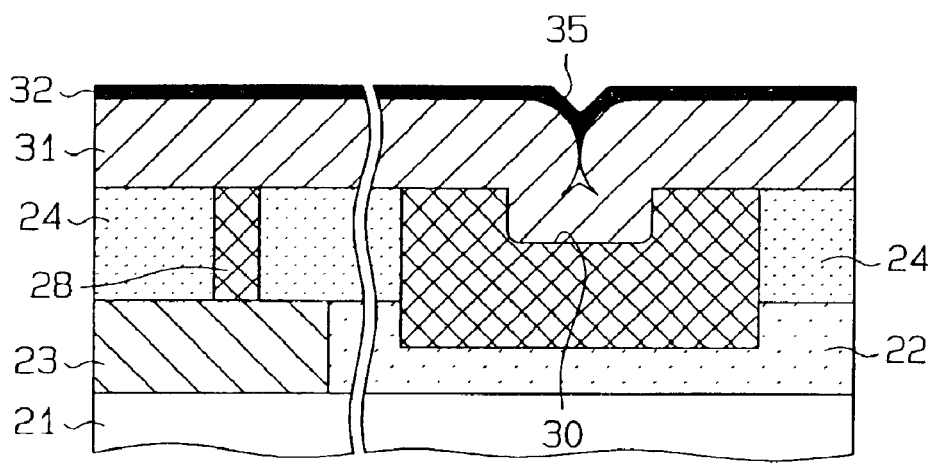
FIGS. 9A to 9C are cross-sectional views illustrating a process for patterning a wiring layer in the second embodiment.

Subsequently, an upper wiring layer of the plug 28 is deposited on the plug 28 and the interlayer insulation film 24, which includes the lower depression 30, as shown in FIG. 9A. For example, Al alloy, which is the material of the wiring layer is deposited to form an Al alloy film 31. Further, a hard mask 32, which is used to etch the Al alloy film 31, is formed on the Al alloy film 31. The thickness of the Al alloy film is, for example "0.4 μm," and the thickness of the hard mask 32 is "0.05 μm." The width of the lower depression 30 is significantly greater than the depth D2 of the lower depression 30. Thus, when each film is deposited, an upper depression 35, which indicates the position of the lower depression 30, is formed in the alignment mark pit 26 even after the Al alloy film 31 and the hard mask 32 are deposited.

Figure 9B:
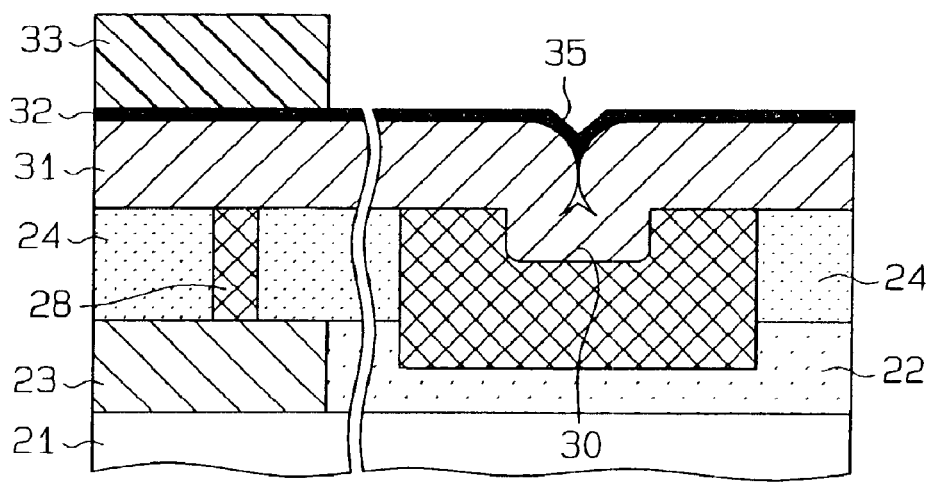
Figure 9C:
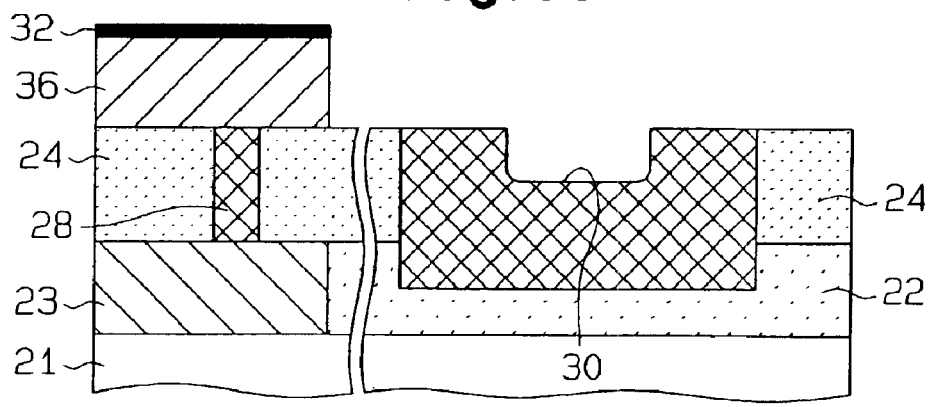

Then, a resist 33 is deposited on the surface of the hard mask 32, which includes the upper depression 35. Lithography is performed, referring to the upper depression 35 for alignment, to transcribe a mask pattern (wiring pattern) on the resist 33. The resist 33 is patterned in accordance with the transcribed wiring pattern (FIG. 9B). Excluding the portion covered by the resist 33, the Al alloy film 31 and the hard mask 32 are etched. Then, the resist 33 is removed. This forms a wiring 36. The wiring 36, which is an interlayer wiring, is accurately aligned with the plug 28 (FIG. 9C).

FIG. 10 shows an experiment result obtained by the inventors and indicates the recognition of the depression and the existence of etching residue with respect to the depth D2 of the lower depression 30. More specifically, FIG. 10 shows whether the alignment lower depression 30 can be recognized and whether the lower depression 30 includes an etching residue subsequent to the etching of the Al alloy film 31 in the lithography process in which the resist 33 is patterned.

As shown in FIG. 10, it was confirmed through experiments that the depression cannot be confirmed when the depth D2 of the lower depression 30 is less than "0.1 μm." Further, it was confirmed that the lower depression 30 included an etching residue after etching the Al alloy film 31 when the depth D2 exceeded "0.5 μm."

In the second embodiment, the thickness of the metal film 27 is controlled so that the depth D2 of the depression is included in the range of "0.1 μm to 0.5 μm." Thus, the resist 33, which is used to etch the Al alloy film 31, is accurately patterned with the upper depression 35, or the alignment mark pit 26, and an etching residual is not left in the lower depression 30 when etching is completed.

In addition to the advantages of the first embodiment, the second embodiment has the advantages discussed below.

(1) The metal film 27 is deposited so that its thickness T27 is included in a range defined by subtracting "0.1 μm to 0.5 μm" from the depth D1 of the alignment mark pit 26. Thus, after polishing the metal film 27 until the upper surface of the interlayer insulation film 24 is exposed, the lower depression 30 is formed along the deposition shape of the metal film 27 in the alignment mark pit 26. The lower depression 30 is formed to reflect the position of the alignment mark pit 26, and the range of the value of the depth D2 is adjusted between "0.1 μm to 0.5 μm."

(2) Subsequent to the deposition of the Al alloy film 31 and the hard mask 32 in the interlayer insulation film 24, the upper depression 35 succeeds the lower depression 30, which is formed to have the depth D2, with respect to the position information of the alignment mark pit 26. When performing lithography to pattern the resist 33, which is used to etch the Al alloy film 31, the upper depression 35 is recognized as an alignment reference. The Al alloy film 31 and the hard mask 32, which are deposited in the lower depression 30, are etched and removed without leaving a residue in the lower depression 30. Thus, by referring to the lower depression 30 for alignment, accurate patterns are formed on the wirings 36. Since, an etching residue does not remain in the lower depression 30, the abnormal growth of a film caused by the residue is prevented when applying a film to the wiring 36.

It should be apparent to those skilled in the art that the present invention may be embodied in many other specific forms without departing from the spirit or scope of the invention. Particularly, it should be understood that the present invention may be embodied in the following forms.

In the first embodiment, the insulation film in which the alignment mark pit 14 is formed is not limited to the insulation film 12 that is applied to the silicon substrate 11. For example, the insulation film may be an interlayer insulation film, which is a film applied to the insulation film 12 as an underlayer.

In the first embodiment, the transistor 10 formed on the silicon substrate 11 does not have to be a MOSFET and may be another type of transistor, such as a bipolar transistor.

In the second embodiment, the barrier film (titanium nitride film (TiN)), which is formed prior to the deposition of the metal film 27, is not necessarily required. The material of the barrier film may be changed in accordance with the employed material of the metal film 27.

In the second embodiment, the metal film (buried film) 27 may be formed by depositing, for example, copper (Cu) through electroplating or electroless plating. The metal film does not have to be made of metal as long as it is made of a conductive wiring material. It is only required that a wiring material enabling the deposition of a film with uniform thickness be used to accurately control the thickness of the deposited film. The wiring material of buried film may be one of a group consisting of, for example, tungsten (W), copper (Cu), aluminum (Al), titanium (Ti), tantalum (Ta), silicon (Si), and an alloy including one of these metals.

In the second embodiment, the thickness T27 of the metal film 27 may be set to any value to satisfy conditions (A) and (B).

Figure 11A:
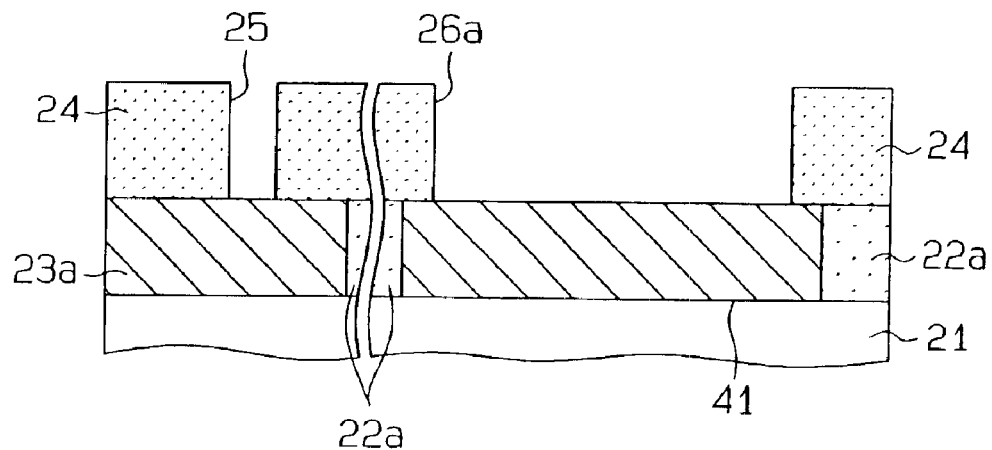
FIGS. 11A to 11C are cross-sectional views showing a process for forming a plug in a modification of the second embodiment.
Figure 11B:
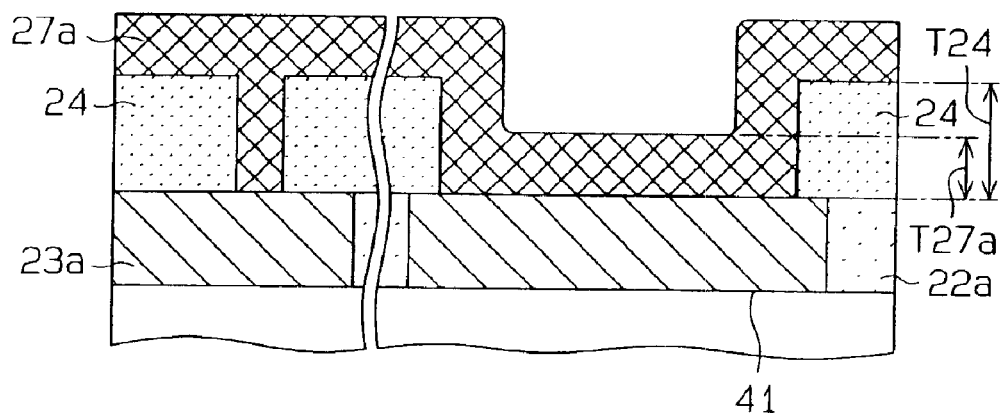
Figure 11C:
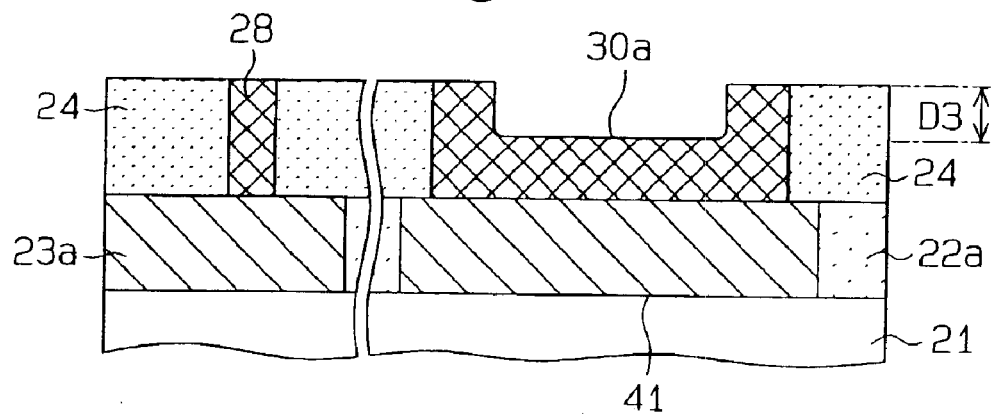
Figure 12A:
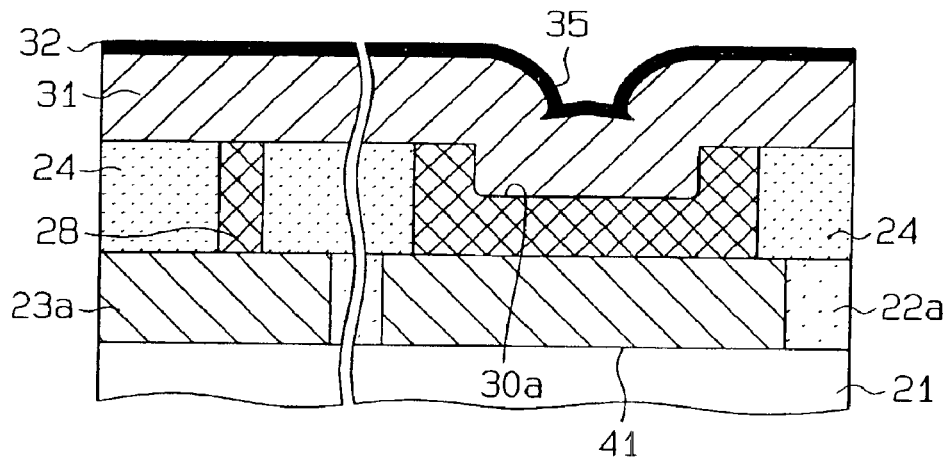
FIGS. 12A to 12C are cross-sectional views showing a process for patterning a wiring layer in the embodiment of FIGS. 11A to 11C.
Figure 12B:
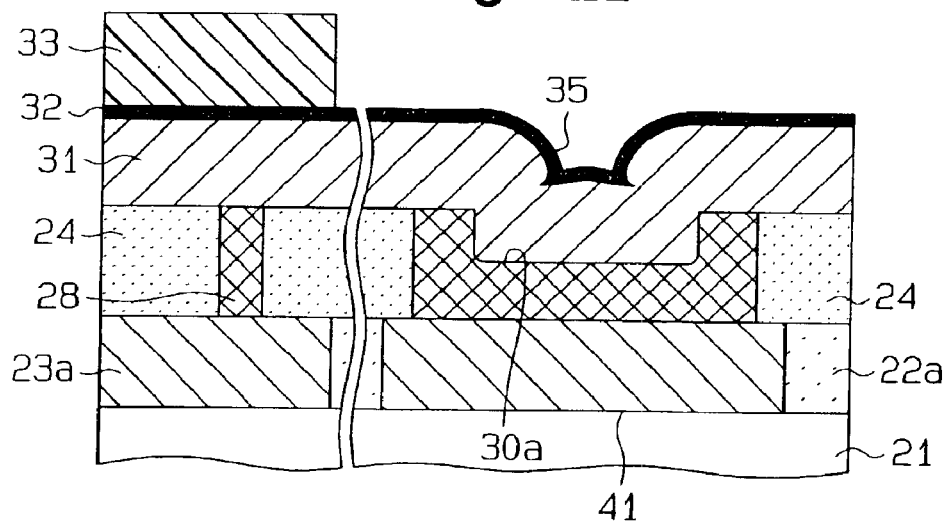
Figure 12C:
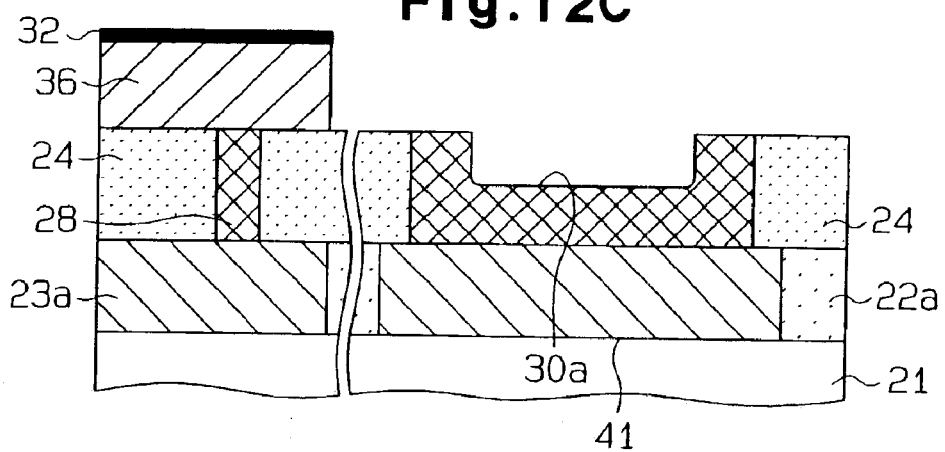

In the second embodiment, for example, an etching stopper 41 may be arranged in an insulation film 22a in accordance with the process illustrated in FIG. 8. The insulation film 22a is located under an interlayer insulation film 24. An alignment mark pit 26a is formed through etching in the interlayer insulation film 24. A wiring 23a is formed from the same material as the etching stopper 41, which is formed at a position corresponding to the alignment mark pit 26a (FIG. 11A). Subsequently, the metal film 27a is deposited on the interlayer insulation film 24 so that the thickness T27a of the metal film 27a is included in a range defined by subtracting "0.1 μm to 0.5 μm" from the thickness T24 of the interlayer insulation film 24 (FIG. 11B). The CMP process is performed to form a lower depression 30a in the alignment mark pit 26a. The lower depression 30a is formed to have a depth D3 that is included in the range of "0.1 μm to 0.5 μm" (FIG. 11C). Accordingly, as shown in FIGS. 11A to 11C, a pattern is accurately formed above the lower depression 30a by referring to the lower depression 30a for alignment without leaving any foreign material. The depth of the alignment mark pit 26a is formed so that the depth of the alignment mark pit 26a is equal to the thickness T24 of the interlayer insulation film 24 even if over-etching is performed on the interlayer insulation film 24. Thus, the lower depression 30a is optimally formed by a simple condition (T24–T27a) determined only by the thickness of the interlayer insulation film 24 and the metal film 27a. This further facilitates alignment using the alignment mark pit 26a. The etching stopper 41 does not have to be formed at the same time as the wiring 23a. Further, the etching stopper 41 does not have to be made of the same metal as the wiring 23a and does not have to formed to have the same thickness as the insulation film 22a. It is only required that the etching stopper 41 functions to stop over-etching of the interlayer insulation film 24. Further, after the alignment mark pit 26a is formed to have an accurate depth and the metal film 27a is polished through the CMP process, the depth D3 of the lower depression 30a is formed in the range of "0.1 μm to 0.5 μm."

In each of the above embodiments, the alignment mark pits may be formed to have any shape as long as it can be recognized as a reference for alignment.

In each of the above embodiments, the insulation film, which is etched to form an alignment mark pit, may be an inorganic SOG film.

In each of the above embodiments, the method for forming an alignment mark pit may be applied to, for example, the formation of a damascene wiring in an insulation film using Cu as a buried wiring.

In each of the above embodiments, prior to the deposition or polishing of the buried film, boron may be ion implanted from the surface of the insulation film. The ion implantation increases the adhering strength of the interface between the buried film and the insulation film and decreases the amount of moisture included in the organic film. As a result, the manufacturing efficiency and reliability of the semiconductor device is increased. Further, the capacitance between wirings is decreased and the capacity of the semiconductor device is increased. Additionally, by performing heat processing on the substrate after ion implantation, the re-crystallization of the buried film is enhanced and the reliability of the wiring is improved.

In each of the above embodiments, the semiconductor substrate does not have to be a silicon substrate and may be any kind of semiconductor substrate that enables the formation of a semiconductor device.

The present examples and embodiments are to be considered as illustrative and not restrictive, and the invention is not to be limited to the details given herein, but may be modified within the scope and equivalence of the appended claims.

What is claimed is:

1. A method for manufacturing a semiconductor device, the method comprising the steps of:

depositing an insulation film above a semiconductor device;

etching the insulation film to form a buried wiring hole and an alignment mark pit, which is used for alignment, in the insulation film;

depositing a conductive film on the surface of the insulation film that includes the buried wiring hole and the alignment mark pit, wherein the step of depositing the conductive film includes depositing the conductive film so that the thickness of the conductive film is less than the depth of the alignment mark pit and less than half of a minimum opening width of the alignment mark pit;

forming a buried film in the alignment mark pit and forming a buried wiring in the buried wiring hole to flatten the surface of the deposited conductive film until the surface of the insulation film is exposed;

depositing a wiring film on the buried film in the alignment mark pit, the buried wiring, and the insulation film after the flattening by means of the chemical mechanical polishing;

forming a hard mask on the surface of the wiring film so that an upper depression is formed above the alignment mark pit;

transcribing a wiring pattern on the hard mask by performing lithography so that the upper depression is used as an alignment mark; and etching the wiring film excluding the portion on which the wiring pattern is transcribed;

wherein the step of depositing the conductive film includes depositing he conductive film so that a lower depression is formed between the surface of the insulation film and the surface of the buried film in the alignment mark pit, the depth of the lower depression being set so that the wiring film does not remain in the lower depression subsequent to the step of etching the wiring film.

2. The method according to claim 1, wherein the step of depositing the conductive film includes depositing the conductive film so that the depth of the lower depression is 0.5 μm or less.

3. The method according to claim 1, wherein the step of depositing the wiring film includes depositing the wiring film using a material that includes aluminum.

4. A method for manufacturing a semiconductor device, the method comprising the steps of:

depositing an insulation film above a semiconductor device;

etching the insulation film to form a buried wiring hole and an alignment mark pit, which is used for alignment, in the insulation film, wherein the etching step includes forming the alignment mark pit so that the depth of the alignment mark pit is equal to the thickness of the insulation film;

depositing a conductive film on the surface of the insulation film that includes the buried wiring hole and the alignment mark pit, wherein the step of depositing the conductive film includes depositing the conductive film so that the thickness of the conductive film is less than the thickness of the insulation film and less than half of a minimum opening width of the alignment mark pit;

forming a buried film in the alignment mark pit and forming a buried wiring in the buried wiring hole to flatten the surface of the deposited conductive film until the surface of the insulation film is exposed; and forming an etching stopper film at least under a position at which the alignment mark pit is formed before the insulation film is formed.

5. A method for manufacturing a semiconductor device, the method comprising the steps of:

depositing an insulation film above a semiconductor device;

etching the insulation film to form a buried wiring hole and an alignment mark pit, which is used for alignment, in the insulation film, wherein the etching step includes forming the alignment mark pit so that the depth of the alignment mark pit is equal to the thickness of the insulation film;

depositing a conductive film on the surface of the insulation film that includes the buried wiring hole and the alignment mark pit, wherein the step of depositing the conductive film includes depositing the conductive film so that the thickness of the conductive film is less than the thickness of the insulation film and less than half of a minimum opening width of the alignment mark pit;

forming a buried film in the alignment mark pit and forming a buried wiring in the buried wiring hole to flatten the surface of the deposited conductive film until the surface of the insulation film is exposed;

depositing a wiring film on the buried film in the alignment mark pit, the buried wiring, and the insulation film after the flattening by means of the chemical mechanical polishing;

forming a hard mask on the surface of the wiring film so that an upper depression is formed above the alignment mark pit;

transcribing a wiring pattern on the hard mask by performing lithography so that the upper depression is used as an alignment mark; and etching the wiring film excluding the portion on which the wiring pattern is transcribed;

wherein the step of depositing the conductive film includes depositing the conductive film so that a lower depression is formed between the surface of the insulation film and the surface of the buried film in the alignment mark pit, the depth of the lower depression being set so that the wiring film does not remain in the lower depression subsequent to the step of etching the wiring film.

6. The method according to claim 5, wherein the step of depositing the conductive film includes depositing the conductive film so that the depth of the lower depression is 0.5 $\mu$m or less.

7. The method according to claim 5, wherein the step of depositing the wiring film includes depositing the wiring film using a material that includes aluminum.

* * * * *